(12) United States Patent
MacNaughton et al.

(10) Patent No.: US 9,513,565 B2
(45) Date of Patent: Dec. 6, 2016

(54) USING WAFER GEOMETRY TO IMPROVE SCANNER CORRECTION EFFECTIVENESS FOR OVERLAY CONTROL

(71) Applicant: KLA-Tencor Corporation, Milpitas, CA (US)

(72) Inventors: Craig MacNaughton, Los Gatos, CA (US); Sathish Veeraraghavan, Santa Clara, CA (US); Pradeep Vukkadala, Fremont, CA (US); Jaydeep Sinha, Livermore, CA (US); Amir Azordegan, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/683,880

(22) Filed: Apr. 10, 2015

(65) Prior Publication Data

US 2015/0212429 A1    Jul. 30, 2015

Related U.S. Application Data

(62) Division of application No. 14/287,746, filed on May 27, 2014, now Pat. No. 9,029,810.

(60) Provisional application No. 61/828,544, filed on May 29, 2013.

(51) Int. Cl.
| | |
|---|---|
| *H01L 21/66* | (2006.01) |
| *G01B 9/02* | (2006.01) |
| *G03F 7/20* | (2006.01) |
| *H01J 37/317* | (2006.01) |
| *H01J 37/28* | (2006.01) |
| *H01J 37/304* | (2006.01) |

(52) U.S. Cl.
CPC ....... *G03F 7/70616* (2013.01); *G03F 7/70633* (2013.01); *H01J 37/28* (2013.01); *H01J 37/3172* (2013.01); *H01J 37/3174* (2013.01); *H01J 37/304* (2013.01); *H01J 2237/221* (2013.01); *H01J 2237/2814* (2013.01); *H01J 2237/30472* (2013.01); *H01J 2237/30483* (2013.01); *H01J 2237/31701* (2013.01); *H01J 2237/31722* (2013.01)

(58) Field of Classification Search
None
See application file for complete search history.

(56) References Cited

U.S. PATENT DOCUMENTS

| | | | |
|---|---|---|---|
| 6,025,600 A | 2/2000 | Archie et al. | |
| 6,630,362 B1 | 10/2003 | Lensing et al. | |
| 6,928,628 B2 * | 8/2005 | Seligson | G03F 7/705 382/151 |

(Continued)

FOREIGN PATENT DOCUMENTS

KR    10-2002-0064453 A    8/2002

*Primary Examiner* — Michael Logie
(74) *Attorney, Agent, or Firm* — Suiter Swantz pc llo (57) ABSTRACT

Systems and methods for providing improved scanner corrections are disclosed. Scanner corrections provided in accordance with the present disclosure may be referred to as wafer geometry aware scanner corrections. More specifically, wafer geometry and/or wafer shape signature information are utilized to improve scanner corrections. By removing the wafer geometry as one of the error sources that may affect the overlay accuracy, better scanner corrections can be obtained because one less contributing factor needs to be modeled.

19 Claims, 5 Drawing Sheets

(56) References Cited

U.S. PATENT DOCUMENTS

| | | |
|---|---|---|
| 7,065,737 B2 | 6/2006 | Phan et al. |
| 9,029,810 B2 * | 5/2015 | MacNaughton ........ H01J 37/28 250/492.1 |
| 2005/0136346 A1 | 6/2005 | Ottens et al. |
| 2005/0161601 A1 | 7/2005 | Kochi et al. |
| 2005/0253067 A1 | 11/2005 | Kawada et al. |
| 2011/0144943 A1 * | 6/2011 | Veeraraghavan ....... H01L 22/12 702/167 |
| 2011/0172982 A1 * | 7/2011 | Veeraraghavan .. G01N 21/9501 703/13 |
| 2011/0216293 A1 * | 9/2011 | Padiy .................. G03F 7/70516 355/52 |
| 2013/0089935 A1 * | 4/2013 | Vukkadala ......... G01B 9/02021 438/5 |
| 2014/0107998 A1 * | 4/2014 | Vukkadala .......... G06F 17/5018 703/14 |
| 2014/0114597 A1 | 4/2014 | Chen et al. |
| 2015/0120216 A1 * | 4/2015 | Vukkadala ............. G01N 19/08 702/35 |

* cited by examiner

USING WAFER GEOMETRY TO IMPROVE SCANNER CORRECTION EFFECTIVENESS FOR OVERLAY CONTROL

TECHNICAL FIELD

The disclosure generally relates to the field of semiconductors, and particularly to overlay control of a semiconductor fabrication process.

BACKGROUND

Fabricating semiconductor devices typically includes processing a substrate such as a semiconductor wafer using a number of semiconductor fabrication processes. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. One of the characteristics being monitored and controlled is the overlay error. An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of the semiconductor fabrication processes.

When overlay errors are observed, an overlay measurement may be used to apply corrections and to keep overlay errors within desired limits. For example, overlay measurements may be fed into an analysis routine that calculates scanner corrections, referred to as "correctables", as well as other statistics, which may be used by an operator in order to better align the lithography tool used in the process.

In typical fabrication operations, semiconductor manufacturing processes are run in batches called lots. A lot, or a wafer lot, is defined as a quantity of wafers which are processed together as a single group. Conventional overlay monitor and control techniques generally take a single set of scanner corrections and apply the same set for all wafers in the same lot. Such techniques need to be improved.

SUMMARY

The present disclosure is directed to a scanner correction system. The scanner correction system includes an overlay metrology tool configured to collect a raw overlay signature from at least one wafer. The scanner correction system also includes a measurement device configured to collect wafer geometry data from the at least one wafer. The scanner correction system further includes an analyzer in communication with the overlay metrology tool and the measurement device, the analyzer configured to provide a wafer geometry aware scanner correction for the at least one wafer based on the raw overlay signatures and wafer geometry data collected.

An additional embodiment of the present disclosure is directed to a scanner correction method. The scanner correction method may include collecting raw overlay data of a wafer to obtain a raw overlay signature of the wafer; collecting wafer geometry data of the wafer to obtain a shape signature of the wafer; and providing a wafer geometry aware scanner correction for the at least one wafer based on the raw overlay signatures and wafer geometry data collected.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Conventional overlay monitor and control techniques generally take a single set of scanner corrections and apply the same set for all wafers in the same lot. However, it is noted that if a single set of such scanner corrections is taken for all wafers in a given lot and then applied to a subsequent lot for overlay correction, the effectiveness of this single set of scanner corrections is limited. This is because many error sources are grouped together and it is more difficult to fit one equation that effectively removes the various types of error sources at the same time. In addition, when different shape signatures come into the scanner, the scanner corrections, extrapolations and/or interpolations are not optimized and are often over adjusted because existing algorithms are not aware of the shape changes.

It is noted that the various types of error sources affecting the overlay accuracy may include wafer geometry, mark asymmetry, proximity effects, chuck shape, hot spots, metrology precision/accuracy, lens distortion, scan direction, target symmetry and alignment, as well as other contributing factors. The scanner corrections may therefore be considered as a model intended to compensate for a combination of all of these factors.

It is also noted that the effect of wafer geometry on overlay signatures is a systematic relationship. If the systematic overlay errors associated with wafer geometry (such as wafer shape and the like) changes can be removed, the scanner corrections can be applied to a much lower magnitude overlay error. In other words, removing the wafer geometry as one of the error sources that may affect the overlay accuracy will in turn provide better scanner corrections, because one less contributing factor needs to be modeled.

Embodiments of the present disclosure are directed to systems and methods for providing improved scanner corrections. Scanner corrections provided in accordance with the present disclosure may be referred to as wafer geometry aware scanner corrections. It is contemplated the wafer geometry aware scanner corrections will improve overlay accuracies, which in turn will improve performances of the downstream processes. For example, if a lithography engineer is able to use a different set of scanner corrections based on the incoming wafer geometry, the performance can be improved significantly.

Figure 1:
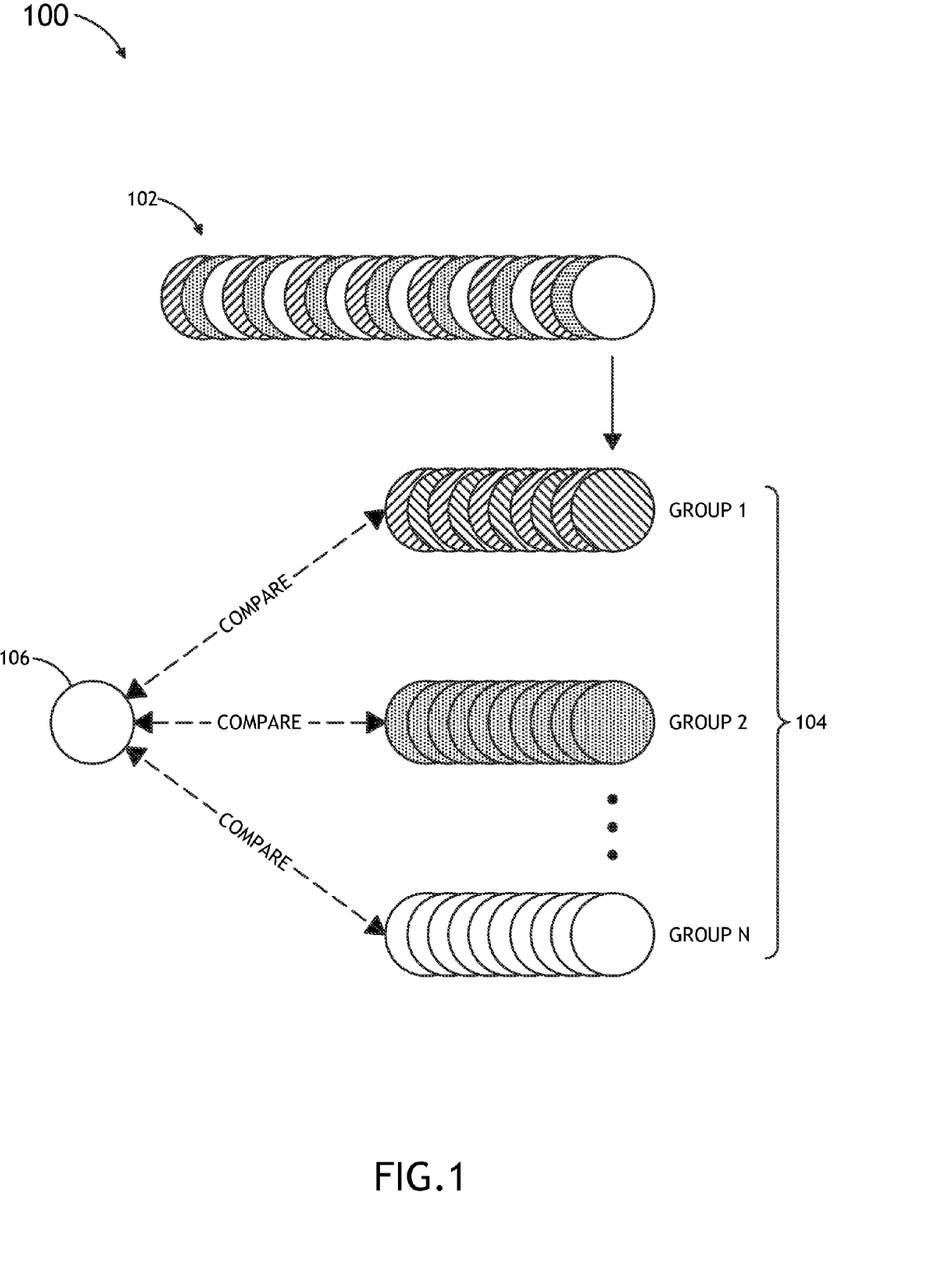
FIG. 1 is an illustration depicting a wafer geometry aware scanner corrections generation process.

Referring to FIG. 1, a block diagram depicting a wafer geometry aware scanner corrections generation process 100 is shown. In one embodiment, wafer geometry data is collected from a reference set 102. The reference set 102 may include wafers selected for training/analysis purposes. Alternatively, the reference set 102 may include wafers from one or more previously processed wafer lots, and historical data collected from such wafers may be utilized for the same purposes. As shown in FIG. 1, the wafers in the reference set 102 may be classified into a plurality of groups 104 based on their wafer geometry data. It is contemplated that the specific number of groups may be predetermined, or may be determined dynamically based on the analysis results utilizing certain classification techniques.

Once the wafers in the reference set 102 have been classified into the plurality of groups 104, appropriate scanner corrections may be calculated independently for each of the plurality of groups 104. For instance, in one embodiment, higher order correctable (may be referred to as HOC) terms are calculated by fitting a higher order (i.e., non-linear) polynomial model to the measured wafer geometry data. It is contemplated, however, that various other techniques for calculating linear and/or higher order scanner corrections may be utilized to accomplish this without departing from the spirit and scope of the present disclosure, as long as each group is independently processed for scanner corrections. It is noted that the resulting scanner corrections calculated from each of the plurality of groups 104 is inherently more accurate because the wafers within each group have similar wafer geometries compared to the reference set 102 as a whole.

Subsequently, the scanner corrections calculated for each of the plurality of groups 104 can be selectively utilized to provide wafer geometry aware scanner corrections for an incoming wafer or wafer lot 106. More specifically, the wafer geometry data of the incoming wafer 106 may be compared to each of the groups 104 in order to identify a best matching group. This comparison process may be carried out by ways of: (i) cross-correlations ($R^2$), (ii) sigma of difference pairs, (iii) a combination of (i) and (ii), or other signature matching schemes.

In the example shown in FIG. 1, suppose the incoming wafer 106 best matches against Group 1, the scanner corrections calculated for Group 1 can then be applied to the incoming wafer 106. In this manner, the incoming wafer 106 is able to apply the scanner corrections that best fit its geometry, significantly improving its overlay accuracy compared to using a single, lot-wise correction value.

It is contemplated that the classification process as described above may also be applicable directly on the incoming wafers. For instance, upon receiving a plurality of incoming wafers or wafer lots, they may be compared amongst themselves and subsequently be classified into a plurality of groups based on their wafer geometry data. Appropriate scanner corrections may then be calculated independently for each of the plurality of groups, and each of the plurality of groups may apply its corresponding scanner corrections accordingly.

Figure 2:
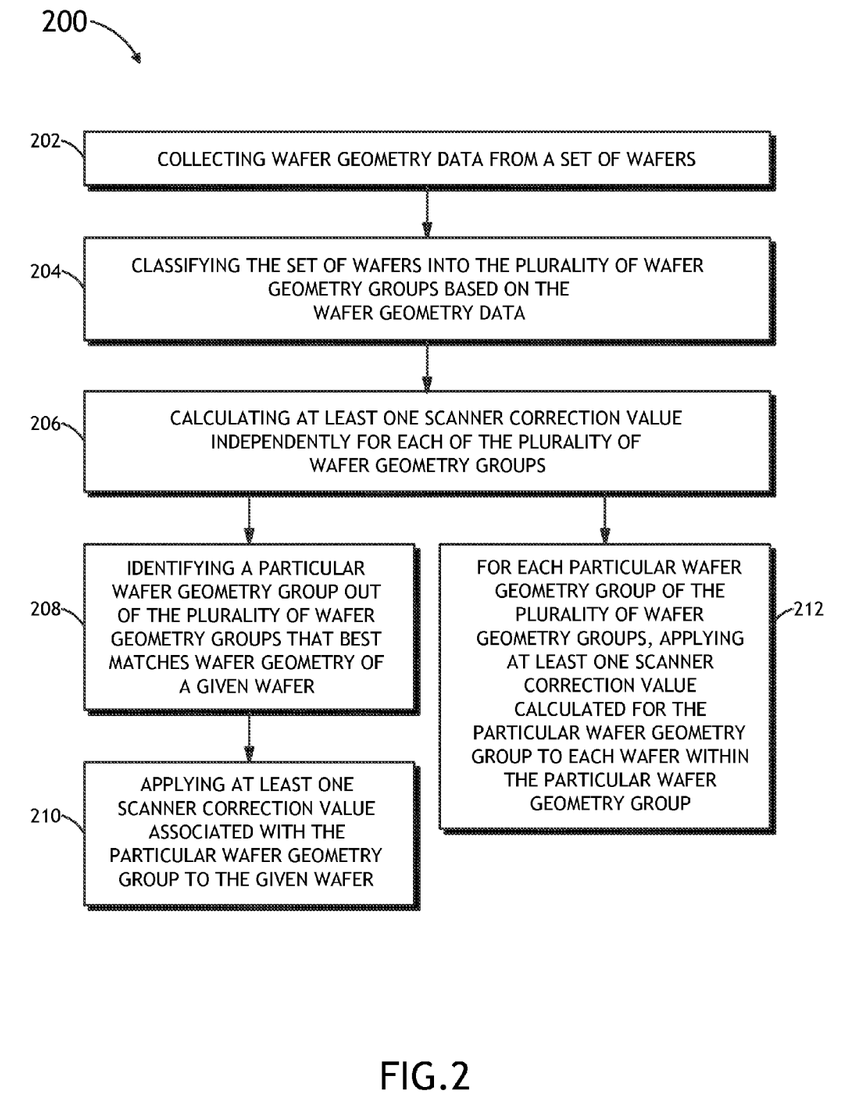
FIG. 2 is a flow diagram illustrating a wafer geometry aware scanner correction method.

FIG. 2 is a flow diagram illustrating a method 200 for providing scanner corrections. As depicted in FIG. 2, wafer geometry data from a set of wafers is collected in step 202. This set of wafers is then classified into at least two wafer geometry groups in step 204. Scanner correction values are subsequently calculated independently for each of the wafer geometry group in step 206.

In one embodiment, the set of wafers being classified is either a reference set or a previously processed set used for training/analysis purposes. This set of wafers effectively helps building a wafer classification library, and when a new wafer is received, this new wafer is compared against the wafer geometry groups in step 208 to identify a best matching group. The scanner correction value(s) calculated for this identified group can then be applied to the new wafer in step 210.

Alternatively, the set of wafers being classified is a set of new wafers, and their corresponding scanner correction values may be calculated without an established classification library. That is, once the scanner correction values have been calculated independently for each of the wafer geometry group in step 206, the scanner correction value(s) calculated for each particular wafer geometry group is applied to each wafer within that particular group in step 212. In this manner, the scanner correction method 200 may be applied to a set of new wafers on-the-fly.

It is contemplated that the term wafer geometry may include various types of commonly used wafer measurement metrics as well as higher order (non-linear) shape characterizations. Higher order shape (HOS) characterizations as disclosed in: Systems, Methods and Metrics for Wafer High Order Shape Characterization and Wafer Classification Using Wafer Dimensional Geometry Tools, Haiguang Chen et al., U.S. patent application Ser. No. 13/656,143, may be calculated and utilized in accordance with the present disclosure. U.S. patent application Ser. No. 13/656,143 is herein incorporated by reference in its entirety.

Figure 3:
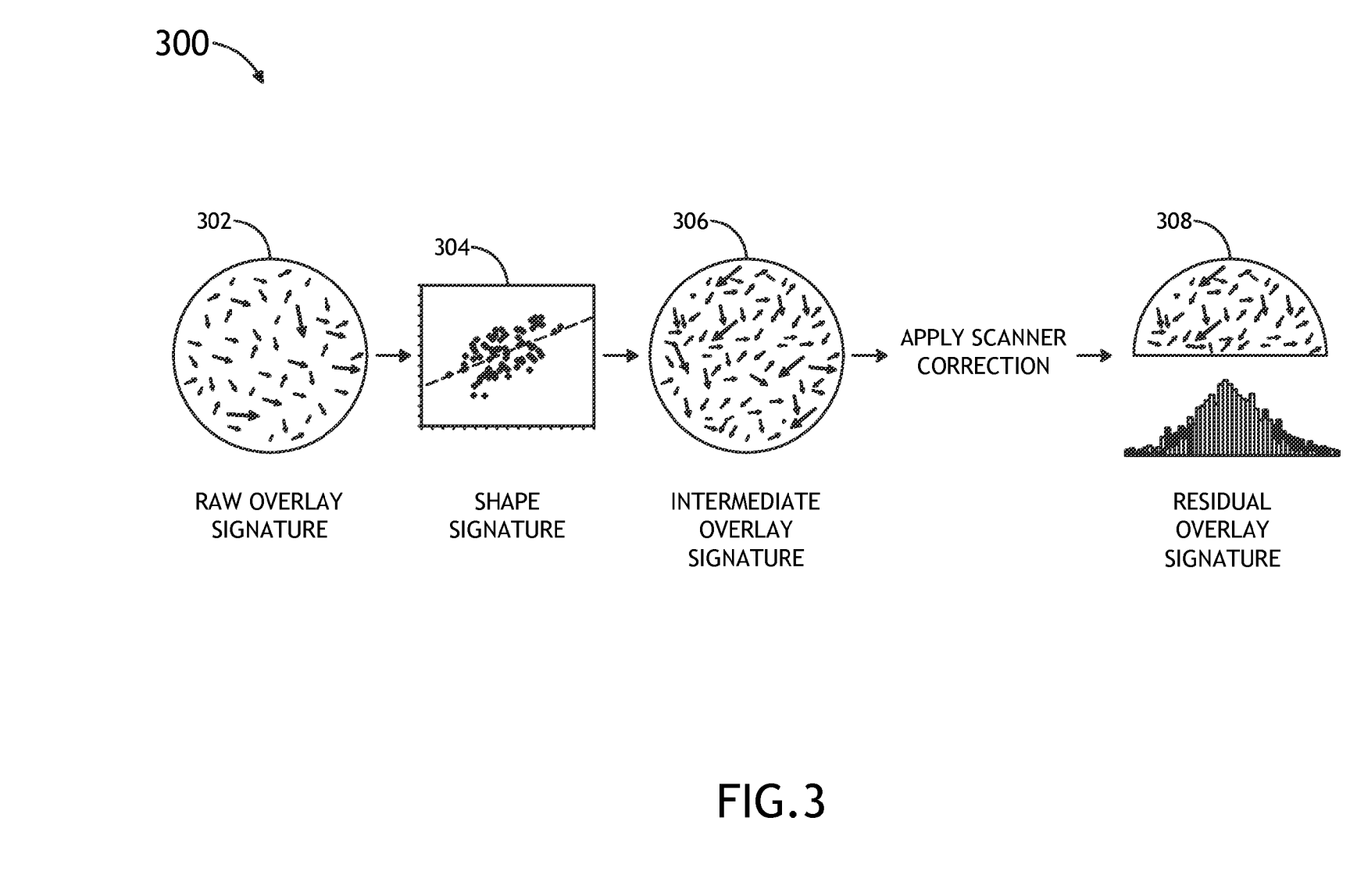
FIG. 3 is an illustration depicting a hybrid shape correction and scanner correction process.

It is contemplated that in addition to facilitate wafer geometry based classification as described above, the wafer geometry data collected from the wafers may also be utilized to make shape based corrections (e.g., to remove shape signatures) before applying the scanner correction values. This process may be referred to as the hybrid shape correction and scanner correction process, which is illustrated in FIG. 3.

In general, this hybrid process takes a raw overlay signature 302 (i.e., measured by an overlay tool) and subtracts the shape signature 304 (i.e., apply shape corrections) from the raw overlay signature 302. In one embodiment, a technique referred to as correction per exposure, or CPE, is utilized to remove the shape signature 304 from the raw overlay signature 302. CPE allows different corrections to be provided for different fields printed by a scanner. Because wafer geometry is known at every point on a given wafer (e.g., 500 um pixel), it is easy to calculate CPE corrections.

Once the shape signature is removed, the resultant signature, referred to as the intermediate overlay signature 306, is obtained. Subsequently, conventional overlay correction and/or the wafer geometry aware scanner correction techniques as described above may be applied to further reduce the overlay signature 308.

Figure 4:
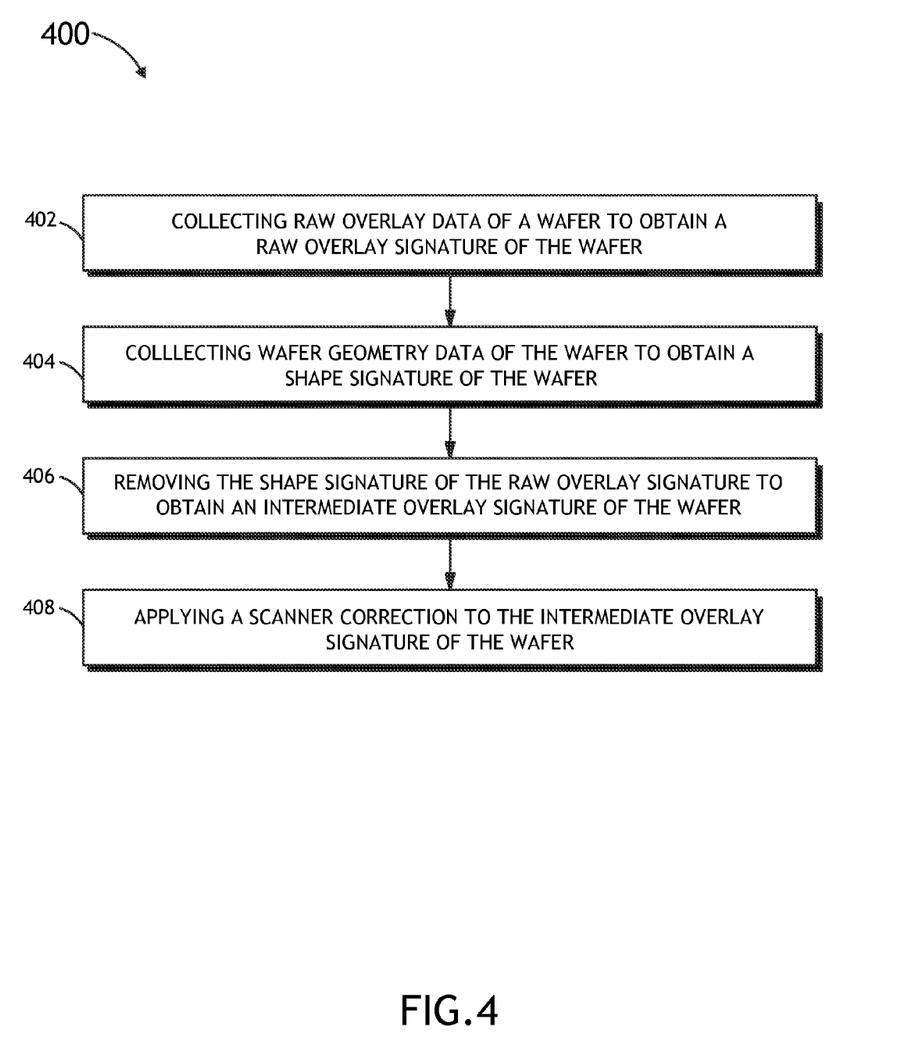
FIG. 4 is a flow diagram illustrating the hybrid shape correction and scanner correction method.

FIG. 4 is a flow diagram illustrating the hybrid shape correction and scanner correction method 400. As depicted in FIG. 4, the raw overlay signature of a wafer is obtained in step 402 and the shape signature of the wafer is obtained in step 404. A processing module (e.g., a computer processor) may then be utilized to remove the shape signature from the raw overlay signature in step 406 to obtain an intermediate overlay signature. This step may help removing the wafer shape as one of the error sources that may affect the overlay accuracy. Subsequently, conventional overlay correction and/or the wafer geometry aware scanner correction techniques as described above are applied to the intermediate overlay signature in step 408.

It is contemplated that the hybrid shape correction and scanner correction method 400 is not only applicable to a single wafer, but also applicable to a group of wafers. For instance, referring to the example depicted in FIG. 1, once the wafers have been classified into the plurality of groups 104, each group may be processed as a unit to calculate its scanner correction values. However, instead of applying such scanner correction values directly on a given wafer that belongs to the group, shape corrections may be applied first and then followed by applying the scanner correction to that wafer. It is contemplated that this hybrid method may help further reduce the effect of wafer shape as one of the error sources contributing to overlay errors.

Figure 5:
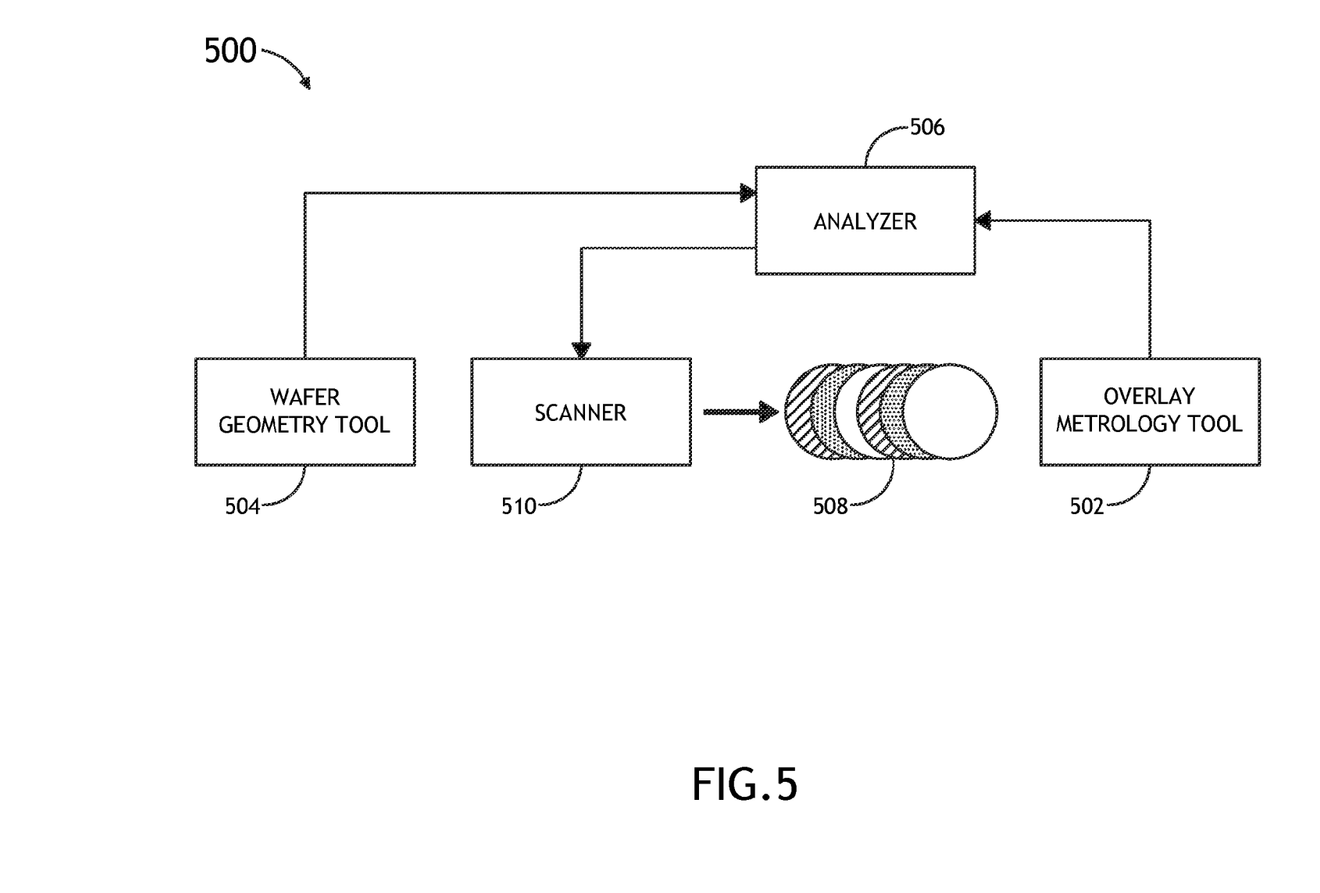
FIG. 5 is a block diagram depicting a scanner correction system.

It is also contemplated that the scanner correction techniques described above can be implemented in various wafer geometry tools and metrology tools. FIG. 5 is a block diagram depicting a scanner correction system 500 in accordance with one embodiment of the present disclosure. The scanner correction system 500 may include an overlay metrology tool 502 configured to collect raw overlay signatures. The scanner correction system 500 may also include a measurement device 504 configured to collect wafer geometry data from a set of wafers. The measurement device 504 may include a wafer geometry tool or any imaging device capable of collecting wafer geometry data. It is noted that a measurement device 504 as such enables the scanner correction system 500 to be aware of the wafer geometry changes and to apply appropriate scanner corrections accordingly.

The scanner correction system 500 also includes an analyzer 506 in communication with both the overlay metrology tool 502 and the measurement device 504. The analyzer 506 may be implemented on a computer processor, a circuitry or the like, that is capable of carrying out the various wafer geometry aware scanner correction methods previously described. Once the wafer geometry aware scanner correction terms are determined for a given wafer (or a set/lot of wafers) 508 utilizing the various wafer geometry aware scanner correction methods previously described, the analyzer 506 may provide the determined wafer geometry aware scanner correction terms to the scanner 510, which may use the determined wafer geometry aware scanner correction terms to help reducing the errors and to better align the wafer and/or the tools used in the fabrication process.

It is contemplated that the methods and systems as described above may be utilized to provide improved scanner corrections for various types of downstream applications. For example, overlay corrections can be performed separately for each wafer geometry group rather than for the entire wafer lot, improving its overlay accuracy. In another example, a different "calibration factor" used for converting wafer geometry data to predicted overlay may be characterized for each group. In addition, analysis such as wafer-to-wafer variation analysis, root-cause analysis for overlay excursion and the like, may also be performed separately for each group so as to get insight into variations produced by dedicated process steps (e.g., a particular chemical vapor deposition chamber) while eliminating confounding variables.

It is contemplated that while the examples above referred to wafer inspections, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A system, comprising:
   an overlay metrology tool configured to collect a raw overlay signature from at least one wafer;
   a measurement device configured to collect wafer geometry data from the at least one wafer; and
   an analyzer in communication with the overlay metrology tool and the measurement device, the analyzer configured to provide a wafer geometry aware scanner correction for the at least one wafer based on the raw overlay signatures and wafer geometry data collected, wherein the wafer geometry aware scanner correction is configured to: identify a particular wafer geometry group out of a plurality of wafer geometry groups that best matches wafer geometry of the at least one wafer, and apply at least one scanner correction value associated with the particular wafer geometry group to the at least one wafer.

2. The system of claim 1, wherein the analyzer is configured to:
   obtain a shape signature of the at least one wafer based on the wafer geometry data collected for the at least one wafer; and
   remove the shape signature from the raw overlay signature of the at least one wafer prior to providing the wafer geometry aware scanner correction.

3. The system of claim 2, wherein the analyzer utilizes a correction per exposure technique to remove the shape signature from the raw overlay signature to obtain an intermediate overlay signature for the at least one wafer.

4. The system of claim 2, wherein the at least one wafer includes a set of wafers, and wherein the analyzer is configured to:
classify the set of wafers into a plurality of wafer geometry groups based on the wafer geometry data; and
calculate at least one scanner correction value independently for each of the plurality of wafer geometry groups.

5. The system of claim 4, wherein said at least one scanner correction value calculated for a particular wafer geometry group is applicable to each wafer of the particular wafer geometry group.

6. The system of claim 4, wherein said at least one scanner correction value calculated for a particular wafer geometry group is applicable to a given wafer outside of the particular wafer geometry group, wherein the particular wafer geometry group is identified as a best matching wafer geometry group for the given wafer.

7. The system of claim 6, wherein the particular wafer geometry group is identified as the best matching wafer geometry group for the given wafer by comparing at least one of: cross-correlations, sigma of difference pairs, and a combination of cross-correlations and sigma of difference pairs between the given wafer and each of the plurality of wafer geometry groups to identify the best matching wafer geometry group.

8. The system of claim 1, wherein the wafer geometry data includes at least one higher order shape characterization.

9. The system of claim 1, wherein the scanner correction values include at least one higher order correction value.

10. The system of claim 1, wherein the system is adapted to provide wafer overlay monitor and control.

11. A method, comprising:
collecting raw overlay data of at least one wafer to obtain a raw overlay signature of the at least one wafer;
collecting wafer geometry data of the at least one wafer; and
providing a wafer geometry aware scanner correction for the at least one wafer based on the raw overlay signatures and wafer geometry data collected, wherein providing the wafer geometry aware scanner correction includes: identifying a particular wafer geometry group out of a plurality of wafer geometry groups that best matches wafer geometry of the at least one wafer; and applying at least one scanner correction value associated with the particular wafer geometry group to the at least one wafer.

12. The method of claim 11, wherein said providing a wafer geometry aware scanner correction for the at least one wafer based on the raw overlay signatures and wafer geometry data collected further comprises:
obtaining a shape signature of the at least one wafer based on the wafer geometry data collected for the at least one wafer; and
removing the shape signature from the raw overlay signature of the at least one wafer prior to providing the wafer geometry aware scanner correction.

13. The method of claim 12, wherein a correction per exposure technique is utilized to remove the shape signature from the raw overlay signature to obtain an intermediate overlay signature of the at least one wafer.

14. The method of claim 12, wherein the at least one wafer includes a set of wafers, and wherein said providing a wafer geometry aware scanner correction for the at least one wafer based on the raw overlay signatures and wafer geometry data collected further comprises:
classifying the set of wafers into a plurality of wafer geometry groups based on the wafer geometry data; and
calculating at least one scanner correction value independently for each of the plurality of wafer geometry groups.

15. The method of claim 14, wherein said at least one scanner correction value calculated for a particular wafer geometry group is applicable to each wafer of the particular wafer geometry group.

16. The method of claim 14, wherein said at least one scanner correction value calculated for a particular wafer geometry group is applicable to a given wafer outside of the particular wafer geometry group, wherein the particular wafer geometry group is identified as a best matching wafer geometry group for the given wafer.

17. The method of claim 16, wherein the particular wafer geometry group is identified as the best matching wafer geometry group for the given wafer by comparing at least one of: cross-correlations, sigma of difference pairs, and a combination of cross-correlations and sigma of difference pairs between the given wafer and each of the plurality of wafer geometry groups to identify the best matching wafer geometry group.

18. The method of claim 11, wherein the method is adapted for providing wafer overlay monitor and control.

19. A system, comprising:
an overlay metrology tool configured to collect raw overlay data of a set of wafers;
a measurement device configured to collect wafer geometry data from the set of wafers; and
an analyzer in communication with the overlay metrology tool and the measurement device, the analyzer configured to:
classify the set of wafers into a plurality of wafer geometry groups based on the wafer geometry data;
calculate scanner correction values for the plurality of wafer geometry groups; and
provide a wafer geometry aware scanner correction for the set of wafers based on the raw overlay signatures and wafer geometry data collected.

* * * * *